United States Patent
Sonderman

(10) Patent No.: US 6,524,774 B1
(45) Date of Patent: Feb. 25, 2003

(54) METHOD OF CONTROLLING PHOTORESIST THICKNESS BASED UPON PHOTORESIST VISCOSITY

(75) Inventor: Thomas Sonderman, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 31 days.

(21) Appl. No.: 09/650,545

(22) Filed: Aug. 30, 2000

(51) Int. Cl.⁷ .............................. G03C 5/00; H01L 21/31
(52) U.S. Cl. ...................... 430/327; 430/330; 438/758; 438/760; 438/780; 438/782
(58) Field of Search ................................ 430/327, 330; 438/758, 760, 782, 780

(56) References Cited

U.S. PATENT DOCUMENTS

| | | | | |
|---|---|---|---|---|
| 6,207,357 B1 | * | 3/2001 | Krauth | 430/327 |
| 6,225,240 B1 | * | 5/2001 | You et al. | 438/782 |
| 6,306,594 B1 | * | 10/2001 | Cozzette et al. | 435/6 |
| 6,317,642 B1 | * | 11/2001 | You et al. | 700/121 |

* cited by examiner

*Primary Examiner*—Janet Baxter
*Assistant Examiner*—Amanda C. Walke
(74) *Attorney, Agent, or Firm*—Williams, Morgan & Amerson, P.C.

(57) ABSTRACT

The present invention is directed to a system and method for controlling the formation of a layer of photoresist. In one illustrative embodiment, the method comprises sensing a viscosity of the photoresist material to be applied on a process layer, providing the sensed viscosity to a controller that determines, based upon the sensed viscosity, at least one parameter of a photoresist application process used to apply the photoresist material, and applying the photoresist using an application process that is comprised of said determined parameter. In one illustrative embodiment, the system is comprised of at least one sensor for sensing the viscosity of the photoresist, a controller that receives the sensed viscosity and determines, based upon the sensed viscosity, at least one parameter of the application process used to apply the photoresist, and a tool for applying the photoresist using a process that includes the determined parameter.

45 Claims, 4 Drawing Sheets

US 6,524,774 B1

METHOD OF CONTROLLING PHOTORESIST THICKNESS BASED UPON PHOTORESIST VISCOSITY

BACKGROUND OF THE INVENTION

1. Field of the Invention

The present invention is generally related to the field of semiconductor processing, and, more particularly, to a method of forming a layer of photoresist above a process layer formed above a semiconducting substrate.

2. Description of the Related Art

In general, semiconductor devices are manufactured by forming many process layers comprised of various materials above a semiconducting substrate, and, thereafter, removing selected portions of the layers, i.e., patterning the layers. This patterning may be accomplished using known photolithography and etching processes to define the various features of the device, e.g., the gate insulation layer, the gate electrode, sidewall spacers, metal lines and contacts, etc. This forming and patterning of the process layers is typically performed layer by layer as the individual layers are formed, although multiple layers may be patterned at any given time.

Photolithography is a common process used in patterning these various layers. Photolithography typically involves the use of a product known as photoresist. In general terms, photoresist is a product that may be changed from a relatively soluble state to a relatively insoluble state by exposure to a light source. There are positive and negative photoresist currently available on the market.

In general, the photolithography process involves forming a layer of photoresist above a previously formed process layer, and exposing selected portions of the layer of photoresist to a light source to form a pattern in the photoresist that is desired to be formed in the underlying process layer. All of these steps are typically performed in well-known photolithography modules that include a section for depositing the photoresist on the wafer, e.g., a spin-coating station, a device for selectively exposing portions of the photoresist layer to a light source through a reticle, e.g., a stepper, and a section for rinsing and developing the photoresist layer after it has been selectively exposed to the light source. Thereafter, an etching process, such as a plasma etching process, is performed to remove portions of the underlying process layer that are not covered by the patterned layer of photoresist, i.e., the patterned layer of photoresist acts as a mask. After the etching process is complete, the patterned photoresist layer is removed so that additional process layers may be formed above the now patterned process layer.

The purpose of the photoresist application step is to form a thin, uniform, defect-free film of photoresist above the substrate surface. A typical layer of photoresist may have a thickness varying from approximately 1500–15,000 Å, and it usually is required to have a uniformity of ±100 Å. Typically, when resist types are switched, and/or the target thickness of the layer of photoresist is changed, test wafers are run to determine the thickness of the photoresist produced by the system. In particular, when photoresist types are switched and/or when the supply of photoresist material is replenished, variations in the viscosity of the photoresist may also adversely impact the formation of layers of photoresist. For example, since the viscosity of the photoresist material is a factor in determining the thickness of a layer of photoresist, test wafers may also be run to determine the thickness of the photoresist layers produced using the new or replenished material. All of these qualification processes are time consuming and generally contribute to less efficient semiconductor manufacturing operations.

The present invention is directed to a method of solving or at least reducing some or all of the aforementioned problems.

SUMMARY OF THE INVENTION

The present invention is directed to a method and system for controlling the thickness of a layer of photoresist based upon the viscosity of the photoresist. In one illustrative embodiment, the method comprises sensing a viscosity of the photoresist material to be applied above a process layer, and providing the sensed viscosity to a controller that determines, based upon the sensed viscosity, at least one parameter of a photoresist application process that will be used to apply the photoresist above the process layer. The method concludes with applying the photoresist material using the application process that includes the determined parameter.

With respect to the novel system disclosed herein, in one illustrative embodiment, it is comprised of at least one sensor for sensing the viscosity of the photoresist material, and a controller that receives the sensed viscosity and determines, based upon the sensed viscosity, at least one parameter of the application process used to apply the photoresist material above a process layer. The system further comprises a tool for applying the photoresist material using an application process that includes the determined parameter.

BRIEF DESCRIPTION OF THE DRAWINGS

The invention may be understood by reference to the following description taken in conjunction with the accompanying drawings, in which like reference numerals identify like elements, and in which.

Figure 1:
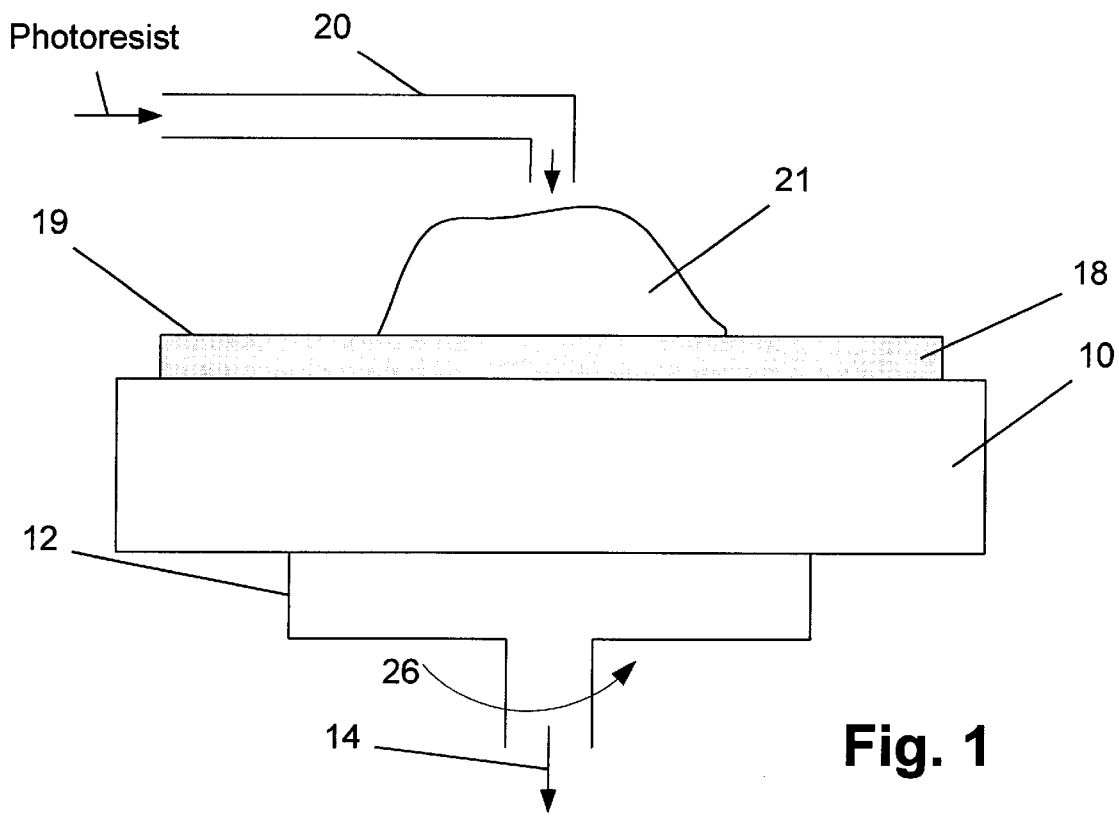
FIG. 1 is a cross-sectional view of a process whereby a quantity of photoresist is positioned on a previously formed process layer.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of controlling the thickness of a layer of photoresist based upon the viscosity of the photoresist. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2:
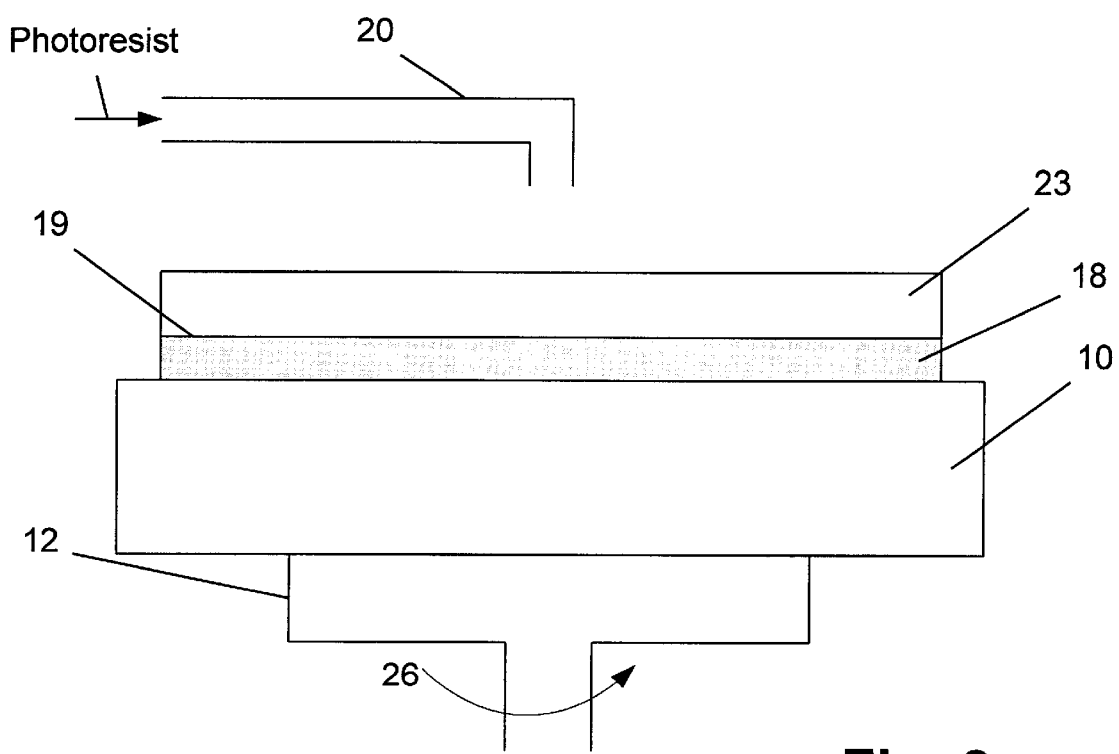
FIG. 2 is a cross-sectional view of a layer of photoresist formed by a spin-coating process.

As shown in FIG. 1, a semiconducting substrate 10, having a process layer 18 formed thereabove, is positioned on a rotational element, such as a vacuum chuck 12. A vacuum may be applied, as indicated by arrow 14, to secure the substrate 10 to the vacuum chuck 12. The vacuum chuck 12 and the substrate 10 are capable of being rotated in the direction indicated by arrow 26. Photoresist from a source (not shown) is applied on the process layer 18 via dispenser arm 20. As shown in FIG. 1, a puddle of photoresist 21 is initially formed above the process layer 18. The substrate 10 may or may not be rotating at the time the puddle of photoresist 21 is deposited on the process layer 18. Thereafter, the substrate 10 is rotated such that a layer of photoresist 23, as shown in FIG. 2, is formed above the surface 19 of the process layer 18. In some photoresist equipment, a given volume of photoresist is held in a container over the process layer 18. At the appropriate time, the photoresist is released or dumped onto the process layer 18. The present invention may also be used with this type of equipment.

As will be recognized by those skilled in the art, the process layer 18 is meant to be illustrative only in that it may be comprised of any of a variety of materials, and there may be one or more intervening process layers between the process layer 18 and the substrate 10. For example, the process layer 18 may be comprised of an oxide, an oxynitride, a nitride, silicon dioxide, silicon nitride, a metal, polycrystalline silicon ("polysilicon"), or any other of a variety of materials used in semiconductor processing operations that may be patterned using photolithographic techniques. Moreover, the photoresist used with the present invention may be either a positive or negative type photoresist.

In the disclosed embodiment, the layer of photoresist 23 is formed by a spin-coating process. In many modern fabrication facilities, the spin-coating process used to form layers of photoresist also involves movement of the dispenser arm 20 (typically in a radial fashion) as the photoresist is deposited on the process layer 18. In that situation, the substrate 10 is rotated at a relatively low speed prior to the deposition of any photoresist material 21 on the process layer 18. As the photoresist material 21 is deposited on the substrate, the dispenser arm 20 moves in a more or less radially outward fashion, beginning at the center of the substrate 10 and moving outward. This technique is used to more evenly distribute the photoresist across the surface 19 of the process layer 18.

Of course, as will be apparent to those skilled in the art upon reading the present application, the present invention is not limited to this particular spin-coating technique. For example, the present invention may be used in situations in which the dispenser arm 20 remains at the approximate center of the substrate 10. In that situation, the substrate 10 is initially rotated at a relatively low speed and photoresist is dispensed in the approximate center of the process layer 18. At that time, the rotational speed of the substrate is increased so as to disperse the photoresist. In yet another alternative embodiment, a static-type spin-coating process may be used in which the photoresist is deposited in the approximate center of a process layer 18 while the process layer 18 is stationary and, thereafter, the substrate 10 is rotated to disperse the photoresist evenly across the surface 19 of the process layer 18. If desired or required, a separate primer coating process may also be used prior to depositing the photoresist above the process layer 18.

In general, the present invention is directed to sensing the viscosity of the photoresist, determining, based upon the sensed viscosity, at least one parameter of the photoresist application process, and applying the photoresist using an application process comprised of the determined parameter. The process described herein is useful for controlling the thickness of the layer of photoresist 23. Viscosity is a quantitative measurement of the ability of a liquid to flow. Higher viscosity liquids, such as, for example, motor oils, tend to flow in a more sluggish manner, whereas lower viscosity fluids, such as water, tend to flow more readily. In general, for a desired resist film thickness, and a constant quantity of resist, as the viscosity of the photoresist increases, a greater rotational speed or acceleration of the substrate 10 will be required to achieve the desired thickness. Conversely, for photoresist with a lower viscosity, the rotational speed or acceleration of the substrate 10 may be reduced to achieve the same thickness.

A variety of parameters of the photoresist application process may be varied to compensate for changes in the viscosity of the photoresist. For example, the rotational speed (e.g., revolutions per minute) of the substrate 10 may be changed, the acceleration (e.g, revolutions per minute per minute) of the substrate 10 may be changed, the duration of the spinning process may be increased or decreased, the volume of photoresist to be applied may be increased or decreased, the flow rate of the photoresist supplied to the photolithography tool may also be varied, etc. All of the parameters may be collectively or individually varied to compensate for changes in the viscosity of the photoresist. For example, the speed and acceleration of the spinning process may both be varied in response to a sensed viscosity of the photoresist. Additionally, it should be understood that the present invention should not be considered limited to modifying, adjusting or determining the above-listed parameters, as other parameters may also be modified.

Figure 3:
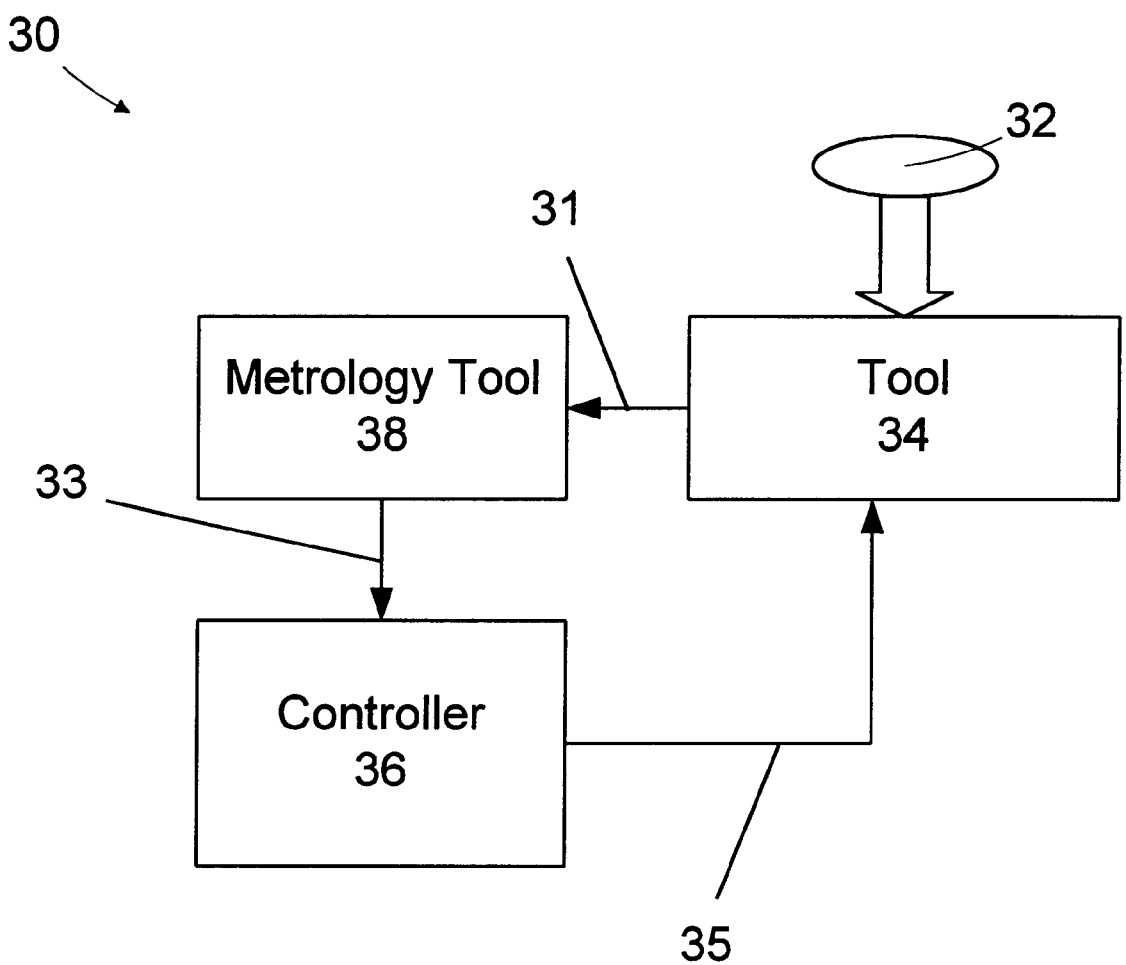
FIG. 3 depicts one illustrative embodiment of a system that may be employed with the present invention.

FIG. 3 depicts one illustrative embodiment of a system 30 that may be used with the present invention. As shown therein, a system 30 for processing wafers 32 is comprised of a tool 34, used for forming a layer of photoresist 23, an illustrative metrology tool 38, and an automatic process controller 36. The metrology tool 38 is used to measure or sense the viscosity of the photoresist material to be applied by the tool 34. If desired, multiple metrology tools 38 may be employed at various locations in the system. Additionally, the metrology tool 38 may be used to obtain one or more readings of the viscosity of the photoresist material.

In one embodiment, the automatic process controller 36 interfaces with the metrology tool 38 to control or determine at least one parameter of the photoresist application process, e.g., the rotational speed of the substrate 10. In particular, the viscosity of the photoresist material is sensed by the metrology tool 38, via line 31, and that information is supplied to the controller 36, via line 33. Thereafter, the controller 36 determines and/or controls at least one parameter of the photoresist application process used to form the layer of photoresist 23 above the process layer 18. That is, the viscosity of the photoresist material is fed forward to the controller 36, and one or more parameters of the photoresist application process is determined or adjusted based upon this measured or determined viscosity. For example, all other things being equal, as the viscosity of the photoresist material increases, the rotational speed of the substrate 10 must also be increased to maintain the same film thickness. Conversely, as the viscosity of the photoresist material decreases, the rotational speed of the substrate 10 must also be decreased to maintain the same film thickness.

The metrology tool 38 may be any type of device capable of measuring the viscosity of the photoresist material, e.g., a Model TT-100 in-line viscometer manufactured by Brookfield of Middleborough, Mass. Moreover, the metrology tool 38 may be a stand-alone device or system, or it may be incorporated into the tool 34, or a system containing both. Additionally, the metrology tool 38 may be located adjacent a reservoir (not shown) containing the photoresist material. The metrology tool 38 may also be positioned adjacent to, or in line with, a conduit carrying the photoresist.

The tool 34 is used to form a layer of photoresist above the process layer 18. The tool 34 may be any tool useful for forming such layers of photoresist. The tool 34 may be part of a traditional photolithography tool or module, or it may be a separate tool. For example, a TEL Mark V, made by Tokyo Electron may be employed to form a layer of photoresist.

In the illustrated embodiment, the automatic process controller 36 is a computer programmed with software to implement the functions described. Moreover, the functions described for the controller 36 may be performed by one or more controllers spread through the system. However, as will be appreciated by those of ordinary skill in the art, a hardware controller (not shown) designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 36, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 4:
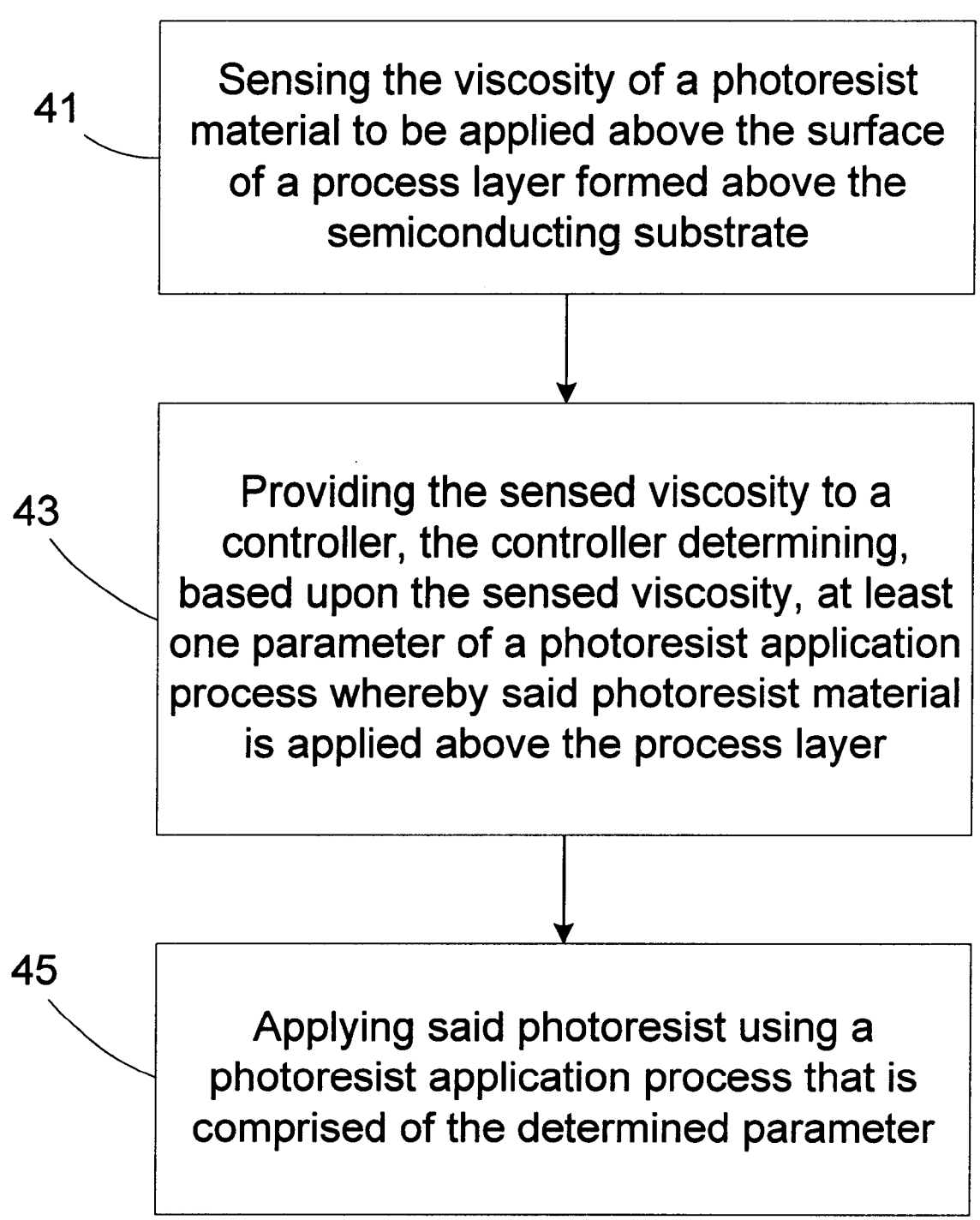
FIG. 4 depicts one illustrative embodiment of the present invention in flowchart form.

One illustrative embodiment of the present invention is depicted in flowchart form in FIG. 4. As shown therein, the method comprises sensing the viscosity of a photoresist material to be applied above the surface of a processor layer formed above a semiconducting substrate, as indicated at block 41. The method further comprises providing the sensed viscosity to a controller that determines, based upon the sensed viscosity, at least one parameter of a photoresist application process whereby the photoresist material will be applied above the processor layer 43, as recited at block 43. In this particular embodiment, the method concludes with the application of the photoresist material using an application process comprised of the determined parameter.

The viscosity sensing, as indicated at block 41, may be performed by one or more sensors, and it may represent a single or multiple readings of the photoresist material. Moreover, the sensed value may represent an average or some other statistical sampling of multiple readings provided by one or more sensors 38. With respect to the step indicated at block 43, the present invention may be used to modify or determine a single process parameter, multiple process parameters, or an entire application process recipe.

Moreover, determining at least one parameter of a photoresist application process to be performed, as indicated at block 43, may be accomplished by a variety of techniques. For example, a database may be developed that correlates an entire photoresist application recipe, or a parameter of the recipe, e.g., duration, rotational speed, acceleration, etc., with the sensed viscosity of the photoresist material. Alternatively, a calculation, based upon the sensed viscosity of the photoresist material, may be made to determine an adjustment to be made to one or more of the application process parameters, e.g., duration, rotational speed, acceleration, etc. Additionally, a model may be developed that correlates one or more parameters of the application process with the sensed viscosity of the photoresist material. Other methodologies are also possible.

Figure 5:
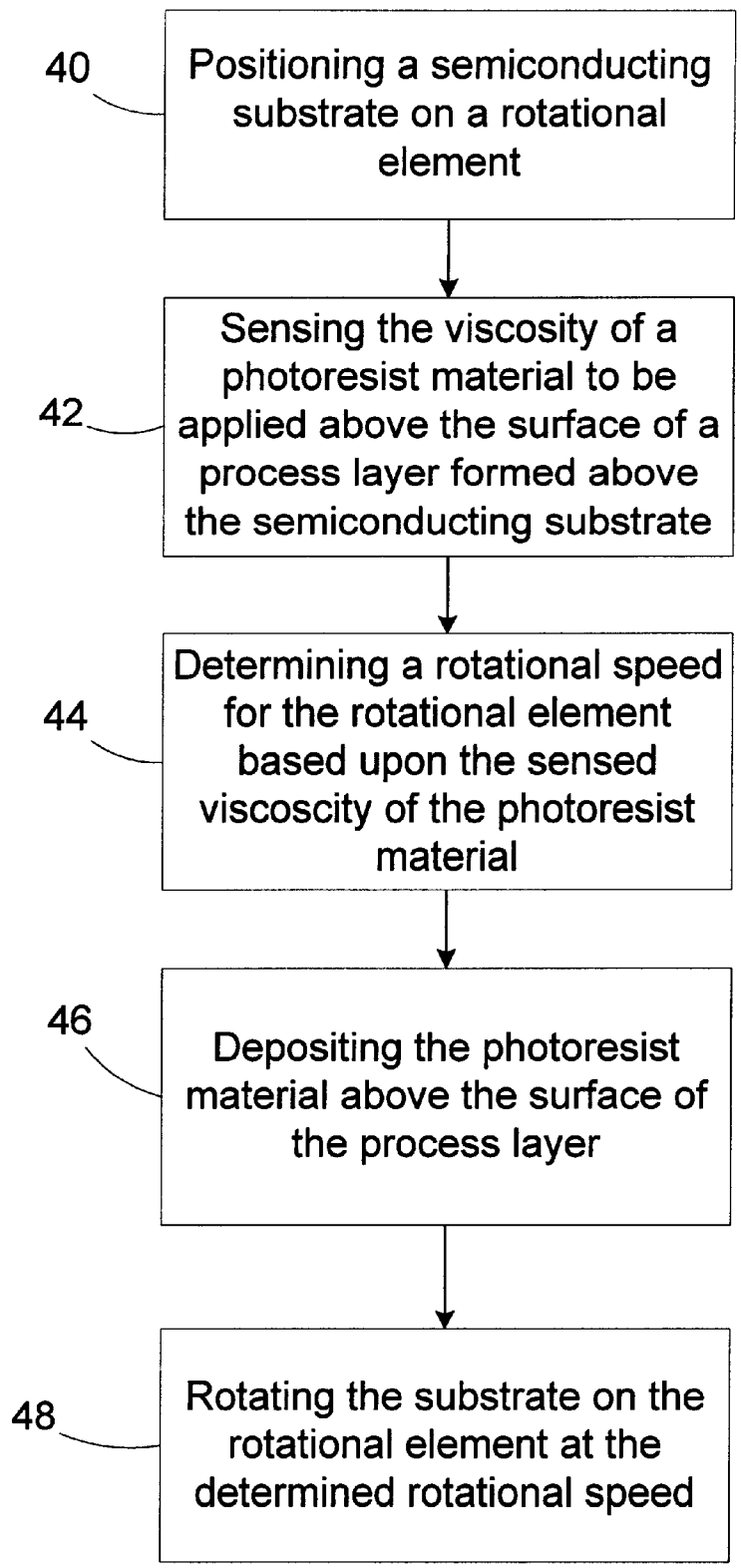
FIG. 5 depicts another illustrative embodiment of the present invention depicted in flowchart form.

Referring to FIG. 5, yet another illustrative embodiment of the present invention is depicted in flowchart form. As shown therein, the present invention comprises positioning a semiconducting substrate on a rotational element, as indicated at block 40, and sensing the viscosity of a photoresist material to be applied above the surface of a process layer formed above the semiconducting substrate, as indicated at block 42. The method further comprises determining a rotational speed of the rotational element based upon the sensed viscosity of the photoresist material, as set forth in block 44, depositing the photoresist material above the process layer, as recited at block 46, and rotating the substrate on the rotational element at the determined rotational speed, as set forth in block 48.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   sensing a viscosity of a photoresist material to be applied above a surface of a process layer formed above a semiconducting substrate;
   providing said sensed viscosity to a controller, said controller determining, based upon said sensed viscosity, at least one parameter of a photoresist application process whereby said photoresist material is applied above said process layer; and
   applying said photoresist material using a photoresist application process that is comprised of said determined parameter.

2. The method of claim 1, wherein said sensing of said viscosity of said photoresist is accomplished by a viscosity sensor positioned adjacent a reservoir containing said photoresist.

3. The method of claim 1, wherein said sensing of said viscosity of said photoresist is accomplished by a viscosity sensor positioned adjacent a conduit through which said photoresist material is supplied.

4. The method of claim 1, wherein said controller determines at least one of a rotational speed of said substrate, an acceleration of said substrate, a volume of photoresist material to be applied, a duration of a spinning process used to spread the photoresist material, and a flow rate of the photoresist material.

5. The method of claim 1, wherein said controller is a stand-alone controller.

6. The method of claim 1, wherein said controller is a component of a tool wherein said photoresist material is applied on said process layer.

7. The method of claim 1, wherein determining, based upon said sensed viscosity, at least one parameter of a photoresist application process comprises calculating at least one parameter of a photoresist application process based upon said sensed viscosity.

8. The method of claim 1, wherein determining, based upon said sensed viscosity, at least one parameter of a photoresist application process comprises correlating at least one parameter of a photoresist application process with said sensed viscosity.

9. The method of claim 1, wherein determining, based upon said sensed viscosity, at least one parameter of a photoresist application process comprises modeling at least one parameter of a photoresist application process with said sensed viscosity.

10. The method of claim 1, wherein said sensed viscosity is an average viscosity that is based upon multiple viscosity readings of said photoresist material.

11. A method, comprising:
    positioning a semiconducting substrate on a rotational element;
    sensing a viscosity of a photoresist material to be applied above a surface of a process layer formed above said semiconducting substrate;
    determining, based upon said sensed viscosity, a rotational speed for said substrate;
    depositing said photoresist material above said process layer; and
    rotating said substrate on said rotational element at said determined rotational speed.

12. The method of claim 11, wherein positioning a semiconducting substrate on a rotational element comprises positioning a semiconducting substrate on a rotational element comprised of a vacuum chuck.

13. The method of claim 11, wherein sensing a viscosity of a photoresist material to be applied above a surface of a process layer formed above said semiconducting substrate comprises sensing a viscosity of a photoresist material to be applied above a surface of a process layer formed above said semiconducting substrate using a Model TT-100 viscometer manufactured by Brookfield.

14. The method of claim 11, wherein depositing said photoresist material above said process layer comprises depositing said photoresist material above said process layer while said substrate is rotating.

15. The method of claim 11, wherein depositing said photoresist material above said process layer comprises depositing said photoresist material above said process layer through a dispenser arm that moves relative to said substrate.

16. The method of claim 11, wherein depositing said photoresist material above said process layer comprises depositing said photoresist material above said process layer while said substrate is stationary.

17. The method of claim 11, wherein said sensed viscosity is an average viscosity that is based upon multiple viscosity readings of said photoresist material.

18. A method, comprising:
    positioning a semiconducting substrate on a rotational element;
    sensing a viscosity of a photoresist material to be applied above a surface of a process layer formed above said semiconducting substrate;
    determining, based upon said sensed viscosity, an acceleration for said substrate;
    depositing said photoresist material above said process layer; and
    accelerating said substrate on said rotational element at said determined acceleration.

19. The method of claim 18, wherein positioning a semiconducting substrate on a rotational element comprises positioning a semiconducting substrate on a rotational element comprised of a vacuum chuck.

20. The method of claim 18, wherein sensing a viscosity of a photoresist material to be applied above a surface of a process layer formed above said semiconducting substrate comprises sensing a viscosity of a photoresist material to be applied above a surface of a process layer formed above said semiconducting substrate using a Model TT-100 viscometer manufactured by Brookfield.

21. The method of claim 18, wherein depositing said photoresist material above said process layer comprises depositing said photoresist material above said process layer while said substrate is rotating.

22. The method of claim 18, wherein depositing said photoresist material above said process layer comprises depositing said photoresist material above said process layer through a dispenser arm that moves relative to said substrate.

23. The method of claim 18, wherein depositing said photoresist material above said process layer comprises depositing said photoresist material above said process layer while said substrate is stationary.

24. The method of claim 18, wherein said sensed viscosity is an average viscosity that is based upon multiple viscosity readings of said photoresist material.

25. A method, comprising:
   positioning a semiconducting substrate on a rotational element;
   sensing a viscosity of a photoresist material to be applied above a surface of a process layer formed above said semiconducting substrate;
   determining, based upon said sensed viscosity, a volume of said photoresist material to be applied above the process layer;
   depositing said determined volume of said photoresist material above said process layer; and
   rotating said substrate on said rotational element.

26. The method of claim 25, wherein positioning a semiconducting substrate on a rotational element comprises positioning a semiconducting substrate on a rotational element comprised of a vacuum chuck.

27. The method of claim 25, wherein sensing a viscosity of a photoresist material to be applied above a surface of a process layer formed above said semiconducting substrate comprises sensing a viscosity of a photoresist material to be applied above a surface of a process layer formed above said semiconducting substrate using a Model TT-100 viscometer manufactured by Brookfield.

28. The method of claim 25, wherein depositing said determined volume of said photoresist material above said process layer comprises depositing said determined volume of said photoresist material above said process layer while said substrate is rotating.

29. The method of claim 25, wherein depositing said determined volume of said photoresist material above said process layer comprises depositing said determined volume of said photoresist material above said process layer through a dispenser arm that moves relative to said substrate.

30. The method of claim 25, wherein depositing said determined volume of said photoresist material above said process layer comprises depositing said determined volume of said photoresist material above said process layer while said substrate is stationary.

31. The method of claim 25, wherein said sensed viscosity is an average viscosity that is based upon multiple viscosity readings of said photoresist material.

32. A method, comprising:
   positioning a semiconducting substrate on a rotational element;
   sensing a viscosity of a photoresist material to be applied above a surface of a process layer formed above said semiconducting substrate;
   determining, based upon said sensed viscosity, a duration for rotating said substrate;
   depositing said photoresist material above said process layer; and
   rotating said substrate on said rotational element for said determined duration.

33. The method of claim 32, wherein positioning a semiconducting substrate on a rotational element comprises positioning a semiconducting substrate on a rotational element comprised of a vacuum chuck.

34. The method of claim 32, wherein sensing a viscosity of a photoresist material to be applied above a surface of a process layer formed above said semiconducting substrate comprises sensing a viscosity of a photoresist material to be applied above a surface of a process layer formed above said semiconducting substrate using a Model TT-100 viscometer manufactured by Brookfield.

35. The method of claim 32, wherein depositing said photoresist material above said process layer comprises depositing said photoresist material above said process layer while said substrate is rotating.

36. The method of claim 32, wherein depositing said photoresist material above said process layer comprises depositing said photoresist material above said process layer through a dispenser arm that moves relative to said substrate.

37. The method of claim 32, wherein depositing said photoresist material above said process layer comprises depositing said photoresist material above said process layer while said substrate is stationary.

38. The method of claim 32, wherein said sensed viscosity is an average viscosity that is based upon multiple viscosity readings of said photoresist material.

39. A method, comprising:
   positioning a semiconducting substrate on a rotational element;
   sensing a viscosity of a photoresist material to be applied above a surface of a process layer formed above said semiconducting substrate;
   determining, based upon said sensed viscosity, a flow rate for said photoresist material;
   applying said photoresist material at said determined flow rate to said process layer; and
   rotating said substrate on said rotational element.

40. The method of claim 39, wherein positioning a semiconducting substrate on a rotational element comprises positioning a semiconducting substrate on a rotational element comprised of a vacuum chuck.

41. The method of claim 39, wherein sensing a viscosity of a photoresist material to be applied above a surface of a process layer formed above said semiconducting substrate comprises sensing a viscosity of a photoresist material to be applied above a surface of a process layer formed above said semiconducting substrate using a Model TT-100 viscometer manufactured by Brookfield.

42. The method of claim 39, wherein applying said photoresist material at said determined flow rate to said process layer comprises applying said photoresist material at said determined flow rate to said process layer while said substrate is rotating.

43. The method of claim 39, wherein applying said photoresist material at said determined flow rate to said process layer comprises applying said photoresist material at said determined flow rate to said process layer through a dispenser arm that moves relative to said substrate.

44. The method of claim 39, wherein applying said photoresist material at said determined flow rate to said process layer comprises applying said photoresist material at said determined flow rate to said process layer while said substrate is stationary.

45. The method of claim 39, wherein said sensed viscosity is an average viscosity that is based upon multiple viscosity readings of said photoresist material.

* * * * *